United States Patent [19]

Hayase et al.

[11] Patent Number: 5,372,908
[45] Date of Patent: Dec. 13, 1994

[54] PHOTOSENSITIVE COMPOSITION COMPRISING A POLYSILANE AND AN ACID FORMING COMPOUND

[75] Inventors: Shuji Hayase, Kawasaki; Yoshihiko Nakano, Tokyo; Yukihiro Mikogami, Yokohama, all of Japan

[73] Assignee: Kabushiki Kaisha Toshiba, Kawasaki, Japan

[21] Appl. No.: 910,407

[22] Filed: Jul. 8, 1992

[30] Foreign Application Priority Data

Jul. 8, 1991 [JP] Japan .................................. 3-167089

[51] Int. Cl.$^5$ ........................ G03F 7/023; G03F 7/004
[52] U.S. Cl. .................................... 430/192; 430/165; 430/193; 430/270; 430/914; 430/919; 430/921; 430/925; 430/926; 528/10; 528/43; 522/31; 522/65; 522/68; 522/148
[58] Field of Search ............... 430/270, 192, 193, 165, 430/914, 919, 921, 925, 926; 528/10, 43; 522/31, 65, 68, 148

[56] References Cited

U.S. PATENT DOCUMENTS

| | | | |
|---|---|---|---|
| 4,587,205 | 5/1986 | Harrah et al. | 430/270 |
| 4,588,801 | 5/1986 | Harrah et al. | 430/326 |
| 4,699,867 | 10/1987 | Schneller et al. | 430/192 |
| 4,822,716 | 4/1989 | Onishi et al. | 430/192 |
| 4,871,646 | 10/1989 | Hayase et al. | 430/192 |
| 4,963,463 | 10/1990 | Koshiba et al. | 430/192 |
| 5,017,453 | 5/1991 | Onishi et al. | 430/270 |
| 5,173,452 | 12/1992 | Dubuzinsky et al. | 430/270 |
| 5,204,226 | 4/1993 | Baier et al. | 430/270 |

FOREIGN PATENT DOCUMENTS

| | | |
|---|---|---|
| 227660 | 6/1990 | Japan . |
| 4291260 | 10/1992 | Japan .................................. 430/192 |
| 4291261 | 10/1992 | Japan .................................. 430/192 |

*Primary Examiner*—Charles L. Bowers, Jr.
*Assistant Examiner*—John S. Chu
*Attorney, Agent, or Firm*—Oblon, Spivak, McClelland, Maier & Neustadt

[57] ABSTRACT

A photosensitive composition comprises a polysilane having a repeating unit represented by formula (1) and a compound which generates an acid upon exposure to light:

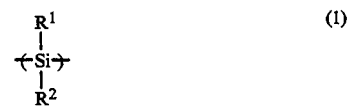

wherein each of $R^1$ and $R^2$ independently represents a hydrogen atom, a substituted or nonsubstituted alkyl group having 1 to 18 carbon atoms, a substituted or nonsubstituted aryl group having 6 to 18 carbon atoms, or a substituted or nonsubstituted aralkyl group having 7 to 22 carbon atoms. This photosensitive composition exhibits a high-sensitivity, and can be formed into a polysilane film pattern having a high-resolution, when it is subjected to exposure to Deep UV light, an EB, an X-ray, or the like, hard baking, and development under appropriate conditions. When an aromatic ring substituted by a hydroxyl group, a substituted or nonsubstituted alkoxyl group, or a substituted or nonsubstituted siloxyl group is introduced in one of side chains $R^1$ and $R^2$ of the polysilane, development using an alkaline solution can be employed.

19 Claims, No Drawings

PHOTOSENSITIVE COMPOSITION COMPRISING A POLYSILANE AND AN ACID FORMING COMPOUND

BACKGROUND OF THE INVENTION

1. Field of the Invention

The present invention relates to a photosensitive composition capable of forming a polysilane film pattern.

2. Description of the Related Art

A polysilane is an organic polymer having an Si—Si backbone chain and exhibiting semiconductor properties. A polysilane is known as a material which is singly subjected to a decomposition or crosslinking reaction upon exposure to light, e.g., an EB or X-ray and changes its solubility in a solvent. For this reason, the polysilane has received a great deal of attention as an organic semiconductor material capable of singly forming a pattern by exposure and development on the basis of the above properties. When the polysilane, however, is used singly to form a pattern, the resultant pattern has an insufficient sectional shape and insufficient resolution.

SUMMARY OF THE INVENTION

The present invention has been made in consideration of the above situation, and has as its object to provide a photosensitive composition capable of forming a polysilane pattern excellent in sectional shape and resolution.

The above object of the present invention can be achieved by a photosensitive composition comprising a polysilane having a repeating unit represented by formula (1) and a compound which generates an acid upon exposure to light:

(1)

wherein each of $R^1$ and $R^2$ independently represents a hydrogen atom, a substituted or nonsubstituted alkyl group having 1 to 18 carbon atoms, a substituted or nonsubstituted aryl group having 6 to 18 carbon atoms, or a substituted or nonsubstituted aralkyl group having 7 to 22 carbon atoms.

When a pattern formation process including exposure and development is applied to a photosensitive composition of the present invention under appropriate conditions, a polysilane film pattern having almost a rectangular sectional shape and a high resolution defined by lines and spaces on the submicron order can be formed.

According to a preferred embodiment, when an aromatic ring substituted by a hydroxyl group or a group for deriving a hydroxyl group is introduced in a side chain of the polysilane in the photosensitive composition of the present invention, development using an alkaline solution can be employed in the pattern formation process.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

DETAILED DESCRIPTION OF THE PREFERRED EMBODIMENTS

The present invention will be described in detail below.

A photosensitive composition of the present invention contains a polysilane as a major component having a repeating unit represented by formula (1) and a compound (to be referred to as a photo-acid generator) as a photosensitive component which generates an acid upon exposure to light.

The polysilane having the repeating unit (1) contains a Si—Si bond as a backbone chain. Each of side chains $R^1$ and $R^2$ independently represents hydrogen, a substituted or nonsubstituted alkyl group, a substituted or nonsubstituted aryl group, or a substituted or nonsubstituted aralkyl group. An average molecular weight of the polysilane used in the present invention preferably falls within the range of about 1,000 to 500,000. If the average molecular weight is less than 1,000, the dissolution rate of the photosensitive composition with respect to a developing solution used in the pattern formation process tends to be excessively high. On the other hand, when the average molecular weight exceeds 500,000, it takes a long period of time to synthesize the polysilane. In addition, the sensitivity of the photosensitive composition tends to be decreased.

Specific examples of the polysilane will be listed below.

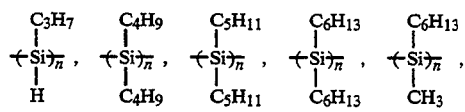

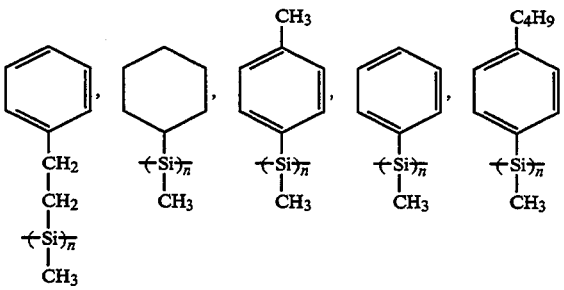

n represents a degree of polymerization.

According to the present invention, the polysilane having the repeating unit (1) preferably contains an aromatic ring substituted by at least one hydroxyl group or at least one group (e.g., an alkoxyl group or a siloxyl group) for deriving a hydroxyl group in at least one side chain, i.e., at least one of $R^1$ and $R^2$. More specifically, this polysilane is a polysilane having the repeating unit (1), in which at least one of $R^1$ and $R^2$ represents an aryl group substituted by a hydroxyl group, a substituted or nonsubstituted alkoxyl group, or a substituted or nonsubstituted siloxyl group, or in which at least one of $R^1$ and $R^2$ represents an aralkyl group containing an aromatic ring substituted by a hydroxyl group, a substituted or nonsubstituted alkoxyl group, or a substituted or nonsubstituted siloxyl group. The polysilane having the repeating unit (1) may be a polysilane in which at least one of $R^1$ and $R^2$ represents an aryl or aralkyl group, at least two adjacent positions in the aromatic ring are substituted by alkoxyl groups, and these at least two alkoxyl groups are linked to each other to form a ring. The polysilane may be a copolymer comprising at least two different repeating units.

In the present invention, it is also possible to use as the polysilane having the repeating unit (1) at least two kinds of those such as a mixture of a polysilane containing an aromatic ring substituted by a hydroxyl group in at least one of $R^1$ and $R^2$, and a polysilane containing an aromatic ring substituted by a substituted or nonsubstituted alkoxyl group or a substituted or nonsubstituted siloxyl group in at least one of $R^1$ and $R^2$.

Specific examples of the polysilane in which at least one side chain has an aromatic group substituted by an alkoxyl group and specific examples of the polysilane in which at least one side chain has an aromatic ring substituted by a siloxyl group are listed below. These polysilanes are preferable because they produce hydroxyl groups during only exposure to light and development, and permit the compositions of the present invention to be developed using an alkaline solution. In particular, a polysilane whose side chain has an aromatic group substituted by a siloxyl group is preferable because synthesis can be easily carried out.

<polysilanes in which Side Chains Have Aromatic Rings Substituted by Alkoxyl Groups>

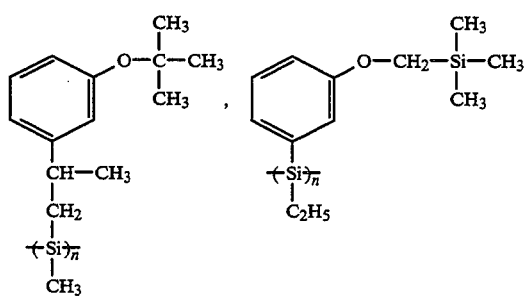

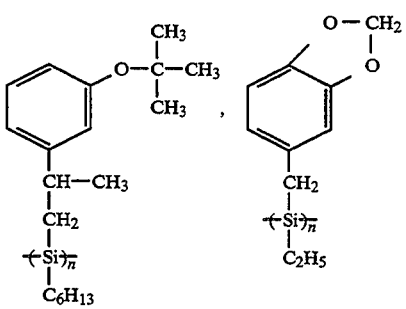

* n represents a degree of polymerization.

<Polysilanes in which Side Chains Have Aromatic Rings Substituted with Siloxyl Groups>

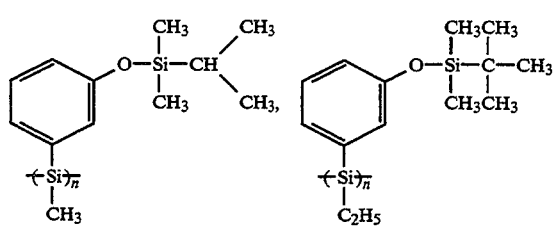

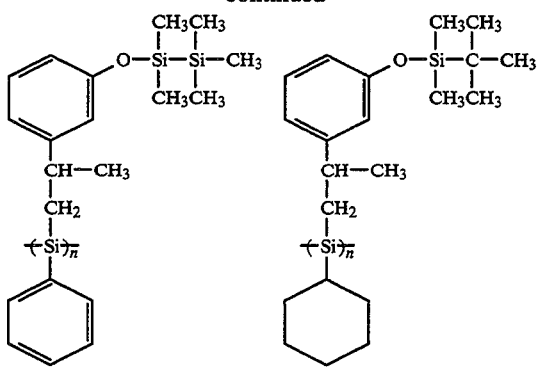

* n represents a degree of polymerization.

On the other hand, in the photosensitive composition of the present invention, the photo-acid generator serving as the photosensitive component is not limited to a specific material if it is a compound decomposed upon exposure to light to generate an acid. Examples of the photo-acid generator are a sulfonium salt, an iodonium salt, a nitrobenzyl compound, and a naphthoquinonediazide compound. Specific examples of the photo-acid generator are listed below. Note that a sulfonium salt is most preferable in practice.

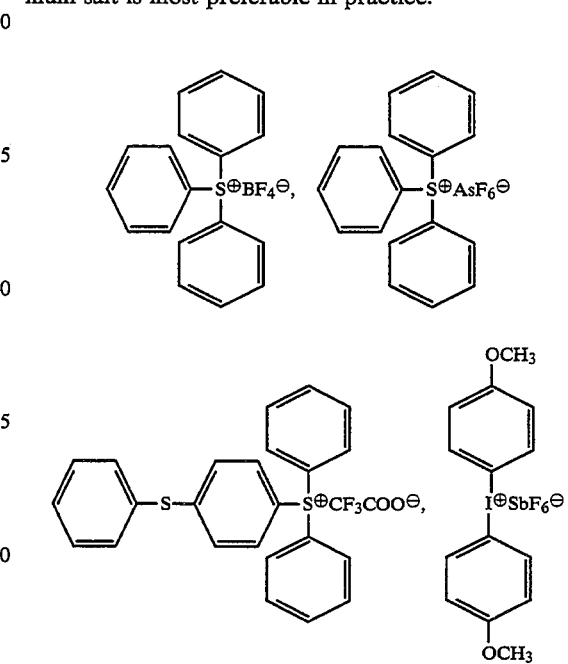

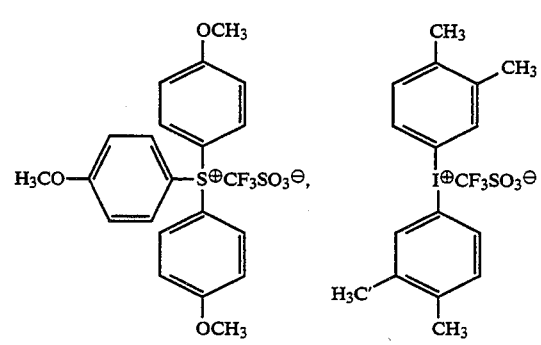

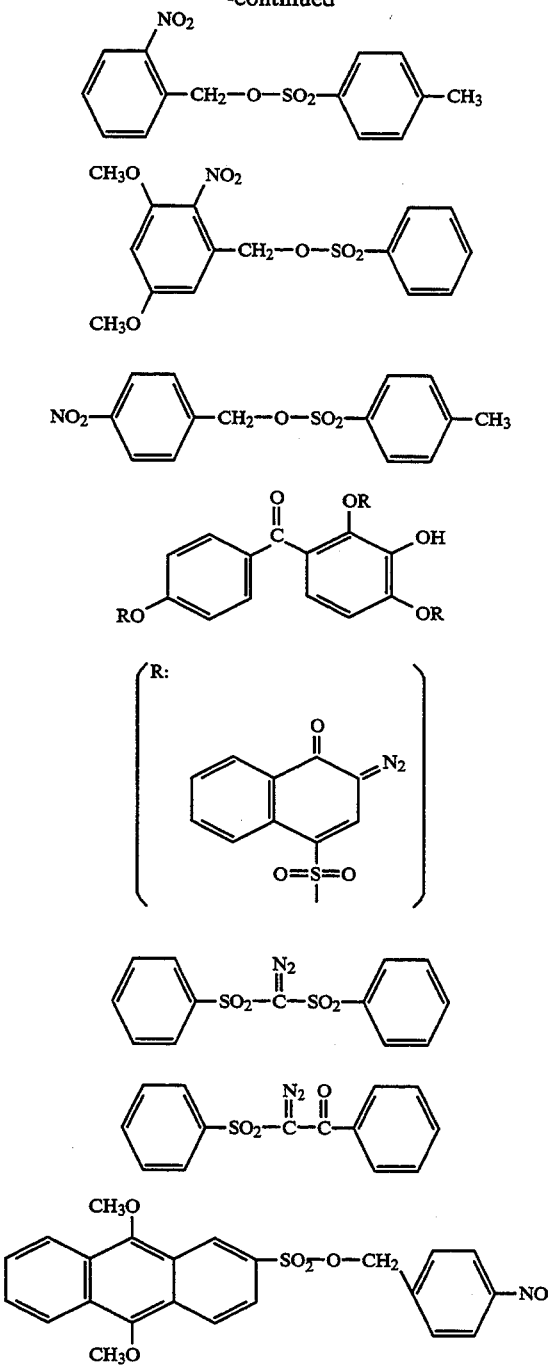

A photosensitive composition of the present invention can be prepared by dissolving a polysilane having the repeating unit (1) and a photo-acid generator, as described above, in an appropriate solvent. Examples of the solvent are toluene, xylene, dimethylformamide, dimethylacetamide, and a cellosolve-series solvent. In this case, about 0.01 to 30 parts by weight and more preferably 0.5 to 5 parts by weight of the photo-acid generator is mixed with 100 parts by weight of a polysilane due to the following reasons. If the amount of the photo-acid generator is less than 0.01 parts by weight, the reaction between the acid generated upon exposure to light and the polysilane becomes insufficient. When the amount of the photo-acid generator exceeds 30 parts by weight, storage stability of the photosensitive com- position and semiconductor properties of a resultant polysilane film (pattern) tend to be adversely affected.

The function of the photosensitive composition of the present invention will be described with reference to a pattern formation process using this photosensitive composition.

The prepared photosensitive composition is coated on a substrate such as a silicon wafer by a spinner, and the film thus formed is then prebaked at about 70° C. to 120° C. to evaporate the solvent to some extent, thereby forming a photosensitive composition layer. This layer is exposed to Deep UV light, a KrF excimer laser light, an electron beam, an X-ray, or the like. After the exposure, the resultant film is hard-baked at about 90° C. to 130° C. as needed.

During the above exposure, in an exposed portion of the photosensitive composition, the photo-acid generator is decomposed to generate an acid. This acid serves as a catalyst to cut the Si—Si backbone chain of the polysilane having the repeating unit (1), thereby reducing its molecular weight. Hard baking is then performed to further reduce the molecular weight of the polysilane.

Subsequently, development of the hard-baked photosensitive composition layer is performed using an organic solvent such as an alcohol-based solvent as a developing solution, and the developed layer is washed. At this time, since the molecular weight of the polysilane is reduced in the exposed portion of the layer, this portion has high solubility in the developing solution. Only the exposed portion is removed by this development, and the nonexposed portion is left unremoved. That is, the photosensitive composition according to the present invention exhibits positive photosensitive properties to obtain a polysilane (film) having a desired pattern.

According to the photosensitive composition of the present invention, a polysilane film pattern can be easily formed in accordance with the above process. In particular, as compared with the conventional case in which a polysilane is used singly, the molecular weight of the polysilane in the exposed portion is greatly reduced by the behavior of the photo-acid generator, and the solubility of the exposed portion in the developing solution can be increased. For this reason, the resultant pattern has an accurate shape (particular, a sectional shape), and its resolution can be improved.

In the photosensitive composition of the present invention, when the polysilane having the repeating unit (1) in which at least one of the side chains, i.e., at least one of $R^1$ and $R^2$ contains an aromatic ring substituted by a hydroxyl group, an alkoxyl group, or a siloxyl group, is used, the resolution of the resultant pattern can be further improved.

When the polysilane having the repeating unit (1) contains an aromatic ring substituted by a hydroxyl group in a side chain thereof, cutting of the Si—Si backbone chain during exposure can be facilitated to further reduce the molecular weight of the polysilane, thereby obtaining a finer pattern. This polysilane exhibits alkali solubility due to a hydroxyl group (e.g., a phenolic hydroxyl group) directly bonded to an aromatic ring. For this reason, an aqueous alkaline solution can be used during development, and the resultant pattern has a higher resolution.

When the polysilane having the repeating unit (1) contains an aromatic ring substituted by an alkoxyl or Siloxyl group in at least one side chain, another reaction occurs in addition to the decrease in molecular weight after exposure. For instance, when hard baking is performed in the presence of an acid generated upon exposure to light, the alkoxyl or siloxyl group bonded to the aromatic ring in the side chain of the polysilane is converted into a hydroxyl group. In this case, at the exposed portion of the photosensitive composition, a hydroxyl group (e.g., a phenolic hydroxyl group) directly bonded to the aromatic ring in the side chain of the polysilane is produced. Therefore, in addition to the fact that development using an aqueous alkaline solution can be used, a solubility difference between the exposed and nonexposed portions of the photosensitive composition in the aqueous alkaline solution can be increased to greatly improve the resolution of the resultant pattern.

Note that a composition containing a carbon-based polymer such as an alkali-soluble polymer and a photo-acid generator which can be used in the present invention is known as a photosensitive composition for forming a micropattern such as a photoresist pattern. Even in this composition, the photo-acid generator is decomposed upon exposure to light to generate an acid. This acid acts on the carbon-based polymer to change the solubility of the composition in the developing solution. In this composition, however, the carbon-based polymer has a high absorbance for exposure to an ultra-violet ray having a wavelength of about 200 nm or less, and particularly, an ArF excimer laser light (193 nm) on the basis of the C—C bond as the backbone chain. This polymer has a low transmittance in this wavelength range. Therefore, when exposure to UV light having a wavelength of about 200 nm is applied to this composition, decomposition of the photo-acid generator does not progress sufficiently, and the composition has a low sensitivity.

To the contrary, in the photosensitive composition of the present invention, UV absorption of the polysilane is shifted to a longer wavelength than the absorption range of a C—C bond, i.e., in the range of about 150 to 200 nm, on the basis of the Si—Si bond as the backbone chain. when exposure to Uv having a wave-length of about 200 nm is applied to the composition of the present invention, it has a high transmittance, and decomposition of the photo-acid generator progress sufficiently. In this manner, the photosensitive composition of the present invention has a very high sensitivity when exposure to an ultraviolet ray having a short wavelength of about 250 nm or less, particularly an ArF excimer laser, is applied.

The present invention will be described in detail by way of its examples. These examples are exemplified to facilitate understanding of the present invention and do not limit the present invention.

EXAMPLES 1-5

Polysilanes and photo-acid generators were mixed in an appropriate solvent following the formulations shown in Table 1 below to prepare photosensitive composition samples of the present invention.

Comparative Examples 1 & 2

Polysilanes shown in Table 1 were prepared as comparative examples. No photo-acid generator was added to a polysilane in each of the comparative examples.

Patterns were formed using the photosensitive composition samples of Examples 1 to 5 and the polysilane samples of Comparative Examples 1 and 2 in accordance with conditions (Table 1) such as coating, exposure (KrF excimer laser: wavelength of 248 nm; or electron beam), hard baking, and development conditions. Exposure amounts (sensitivities) for all the samples and the resolutions and sectional shapes of the resultant patterns are also summarized in Table 1.

The chemical formulas of the compounds represented by symbols in Table 1 are represented in Table A.

TABLE 1

|  | Example | | | | | Comparative Example | |
|---|---|---|---|---|---|---|---|
|  | 1 | 2 | 3 | 4 | 5 | 1 | 2 |
| Polysilane A | 100 | — | — | — | — | 100 | — |
| Polysilane B | — | 100 | — | — | — | — | 100 |
| Polysilane C | — | — | 100 | — | — | — | — |
| Polysilane D | — | — | — | 100 | — | — | — |
| Polysilane E (parts by weight) | — | — | — | — | 100 | — | — |
| *1 Photo-acid Generator a | 1 | 1 | 1 | — | — | — | — |
| Photo-acid Generator b | — | — | — | 1 | — | — | — |
| Photo-acid Generator c (parts by weight) | — | — | — | — | 1 | — | — |
| Film Thickness ($\mu$m) | 0.5 | 0.5 | 0.5 | 0.5 | 0.5 | 0.5 | 0.5 |
| Prebake (temperature/time) | 90° C./ 5 min. | 100° C./ 5 min. | 90° C./ 5 min. | 90° C./ 5 min. | 110° C./ 5 min. | 90° C./ 5 min. | 90° C./ 5 min. |
| Exposure (sensitivity: exposure *2) | KrF (16) | EB (5) | KrF (20) | KrF (15) | EB (5) | KrF (250) | EB (15) |
| Hard Bake (temperature/time) | 110° C./ 1 min. | 110° C./ 1 min. | 110° C./ 1 min. | 110° C./ 1 min. | 130° C./ 1 min. | — | — |
| Developing Solution *3 | $\alpha$ | $\beta$ | $\beta$ | $\beta$ | $\beta$ | $\alpha$ | $\alpha$ |
| Developing Time (sec.) | 60 | 90 | 100 | 60 | 60 | 120 | 60 |
| Resolution ($\mu$m) | 0.6 | 0.3 | 0.3 | 0.3 | 0.3 | 0.7 | 0.9 |
| Sectional Shape | 1 | 2 | 3 | 4 | 5 | 6 | 7 |

TABLE 1-continued

|  | Example | | | | | Comparative Example | |
|---|---|---|---|---|---|---|---|
|  | 1 | 2 | 3 | 4 | 5 | 1 | 2 |
| of Pattern | 1 | 2 | 3 | 4 | 5 | 6 | 7 |

1: trapezoidal; 2: rectangular; 3: rectangular; 4: rectangular; 5: rectangular; 6: triangular; 7: triangular
*1: A compound which generates an acid upon exposure to light
*2: Unit: mJ/$cm^2$ for exposure to KrF excimer laser light (Examples 1, 3 and 4 and Comparative Example 1)
μC/$cm^2$ for exposure to EB (Example 2 and 5 and Comparative Example 2)
*3: Developing solution:
α . . . isopropanol/cyclohexane (solution mixture having a weight ratio of 1:1)
β . . . TMAH (2.38 wt % aqueous solution of tetramethylammoniumhydroxide)

TABLE A

<Polysilane>

A: 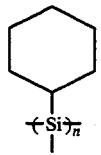

(av. molecular weight: 40,000)

B: 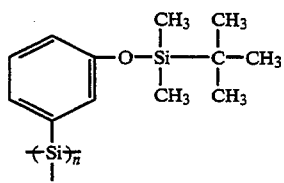

(av. molecular weight: 50,000)

C: 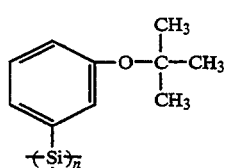

(av. molecular weight: 40,000)

D: 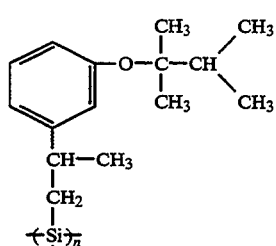

(av. molecular weight: 30,000)

E: 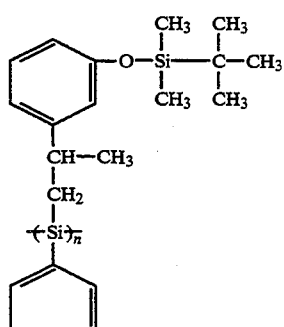

(av. molecular weight: 30,000)

TABLE A-continued

<Photo-acid-generator> a: 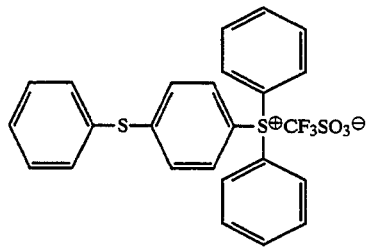

b: 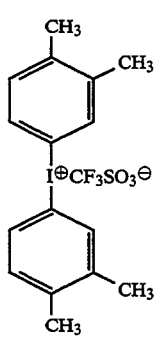

c: 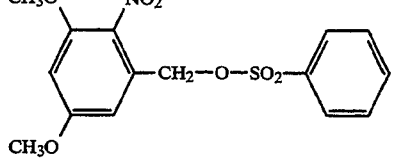

*n represents a degree of polymerization.

As is apparent from the results shown in Table 1, the photosensitive compositions each containing a polysilane having the repeating unit (1) and a photo-acid generator according to the present invention have higher sensitivities than the samples containing only polysilanes of the comparative examples when exposure to a KrF excimer laser light or an EB is applied. The patterns formed by subjecting these compositions to exposure and development are excellent in resolution and sectional shape.

EXAMPLES 6–10

Polysilanes and a photo-acid generator were mixed in an appropriate solvent following the formulations as shown in Table 2 below to prepare photosensitive compositions according to the present invention.

Comparative Example 3

Polyvinylphenol and a photo-acid generator were mixed in an appropriate solvent following the formulation in Table 2 to prepare a photosensitive composition sample. This comparative example is a system containing a carbon-based polymer.

Patterns were formed using the photosensitive composition samples of Examples 6 to 10 and Comparative Example 3 in accordance with conditions (Table 2) such as coating, exposure (ArF excimer laser: wavelength of 192 nm), hard baking, and development conditions. Exposure amounts (sensitivities) for all the samples and the resolutions and sectional shapes of the resultant patterns are also summarized in Table 2.

The chemical formulas of the compounds represented by symbols in Table 2 are represented in Table B.

TABLE 2

| | Example | | | | | Comparative Example |
|---|---|---|---|---|---|---|
| | 6 | 7 | 8 | 9 | 10 | 3 |
| Polysilane F | 100 | — | — | — | — | — |
| Polysilane G | — | 100 | — | — | — | — |
| Polysilane H | — | — | 100 | — | — | — |
| Polysilane I | — | — | — | 100 | — | — |
| Polysilane J (parts by weight) | — | — | — | — | 100 | — |
| Carbon-based Polymer *4 | — | — | — | — | — | 100 |
| Photo-acid Generator d *1 (parts by weight) | 1 | 1 | 1 | 1 | 1 | 1 |
| Film Thickness ($\mu$m) | 0.5 | 0.5 | 0.5 | 0.5 | 0.5 | 0.5 |
| Prebake (temperature/time) | 90° C./ 5 min. | 90° C./ 5 min. | 90° C./ 5 min. | 90° C./ 5 min. | 90° C./ 5 min. | 90° C./ 5 min. |
| Exposure (sensitivity: exposure *2) | ArF (15) | ArF (5) | ArF (15) | ArF (20) | ArF (20) | ArF (35) |
| Hard Bake (temperature/time | 110° C./ 1 min. | 110° C./ 1 min. | 110° C./ 1 min. | 110° C./ 1 min. | 110° C./ 1 min. | 110° C./ 1 min. |
| Developing Solution *3 | β | β | β | β | α | β |
| Developing Time (sec.) | 70 | 30 | 60 | 55 | 50 | 60 |
| Resolution ($\mu$m) | 0.2 | 0.2 | 0.2 | 0.2 | 0.25 | 0.3 |

*1: A compound which generates an acid upon exposure to light
*2: Unit: mJ/cm$^2$
*3: Developing solution:
  α ... isopropanol/cyclohexane (solution mixture having a weight ratio of 1:1)
  β ... TMAH (2.38 wt % aqueous solution of tetramethylammoniumhydroxide)
*4: polyvinylphenol

TABLE B

<Polysilane>

F: (av. molecular weight: 30,000) 50

G: (av. molecular weight: 40,000) 60

65

H: (av. molecular weight: 20,000)

I: (av. molecular weight: 20,000)

J: (av. molecular weight: 30,000)

<Photo-acid-generator>

TABLE B-continued d:

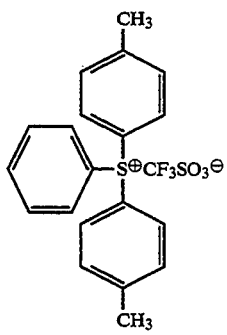

*n represents a degree of polymerization

As is apparent from Table 2, the photosensitive compositions each containing a polysilane having the repeating unit (1) and a photo-acid generator have higher sensitivities than the photosensitive composition containing the carbon-based polymer corresponding to the comparative example in case where they are subjected to exposure to the ArF excimer laser light. In addition, the patterns which are obtained by subjecting the compositions of the present invention to exposure and development are excellent in resolution.

What is claimed is:

1. A photosensitive composition including a mixture of a polysilane and a compound which generates an acid upon exposure to light, said polysilane having a repeating unit represented by formula (1):

wherein each of $R^1$ and $R^2$ independently represents a hydrogen atom, a substituted or nonsubstituted alkyl group having 1 to 18 carbon atoms, a substituted or nonsubstituted aryl group having 6 to 18 carbon atoms, or a substituted or nonsubstituted aralkyl group having 7 to 22 carbon atoms, and with said compound which generates an acid upon exposure to light being at least one selected from the group consisting of a sulfonium salt, an iodonium salt, a nitrobenzyl compound, and a naphthoquinonediazide compound represented by the formula given below:

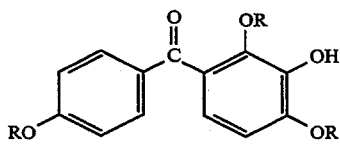

where, R represents:

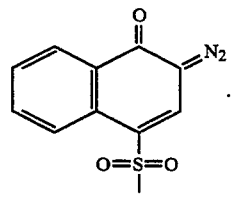

2. The composition according to claim 1, wherein the compound which generates the acid upon exposure to light is the naphthoquinonediazide compound represented by the formula given below:

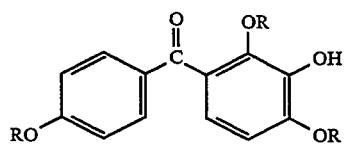

where, R represents:

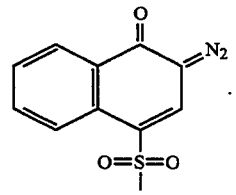

3. The composition according to claim 1, wherein at least one of $R^1$ and $R^2$ represents an aryl group substituted by at least one hydroxyl group.

4. The composition according to claim 1, wherein at least one of $R^1$ and $R^2$ represents an aryl group substituted by at least one substituted or nonsubstituted alkoxyl group.

5. The composition according to claim 1, wherein at least one of $R^1$ and $R^2$ represents an aryl group substituted by at least one substituted or nonsubstituted siloxyl group.

6. The composition according to claim 1, wherein at least one of $R^1$ and $R^2$ represents an aralkyl group containing an aromatic ring substituted by at least one hydroxyl group.

7. The composition according to claim 1, wherein at least one of $R^1$ and $R^2$ represents an aralkyl group containing an aromatic ring substituted by at least one substituted or nonsubstituted alkoxyl group.

8. The composition according to claim 1, wherein at least one of $R^1$ and $R^2$ represents an aralkyl group containing an aromatic ring substituted by at least one substituted or nonsubstituted siloxyl group.

9. The composition according to claim 1, wherein the polysilane is a mixture of a polysilane having an aromatic ring substituted by a hydroxyl group in at least one of $R^1$ and $R^2$ and a polysilane having an aromatic ring substituted by a substituted or nonsubstituted alkoxyl group or a substituted or nonsubstituted siloxyl group in at least one $R^1$ and $R^2$.

10. The composition according to claim 1, wherein an average molecular weight of the polysilane falls within a range of about 1,000 to 500,000.

11. The composition according to claim 1, wherein the compound which generates the acid upon exposure to light is a sulfonium salt.

12. The composition according to claim 1, wherein the compound which generates the acid upon exposure to light is an iodonium salt.

13. The composition according to claim 1, wherein the compound which generates the acid upon exposure to light is a nitrobenzyl compound.

14. The composition according to claim 1, wherein about 0.01 to 30 parts by weight of the compound which generates the acid upon exposure to light is mixed with 100 parts by weight of the polysilane.

15. The composition according to claim 14, wherein about 0.5 to 5 parts by weight of the compound which generates the acid upon exposure to light is mixed with parts by weight of the polysilane.

16. The composition according to claim 4, wherein about 0.01 to 30 parts by weight of the compound which generates the acid upon exposure to light is mixed with parts by weight of the polysilane.

17. The composition according to claim 5, wherein about 0.01 to 30 parts by weight of the compound which generates the acid upon exposure to light is mixed with parts by weight of the polysilane.

18. The composition according to claim 7, wherein about 0.01 to 30 parts by weight of the compound which generates the acid upon exposure to light is mixed with parts by weight of the polysilane.

19. The composition according to claim 8, wherein about 0.01 to 30 parts by weight of the compound which generates the acid upon exposure to light is mixed with 100 parts by weight of the polysilane.

* * * * *